United States Patent
Bian et al.

(10) Patent No.: US 9,747,395 B2
(45) Date of Patent: Aug. 29, 2017

(54) SIMULATED LOADING METHOD AND APPARATUS FOR MOVING LOAD OF WHEEL AXLE IN RAIL TRANSPORTATION

(71) Applicant: ZHEJIANG UNIVERSITY, Hangzhou (CN)

(72) Inventors: Xuecheng Bian, Hangzhou (CN); Hongguang Jiang, Hangzhou (CN); Yunmin Chen, Hangzhou (CN); Chong Cheng, Hangzhou (CN); Jianqun Jiang, Hangzhou (CN); Xiang Xu, Hangzhou (CN); Renpeng Chen, Hangzhou (CN); Wanfeng Jin, Hangzhou (CN)

(73) Assignee: ZHEJIANG UNIVERSITY, Zhejiang (CN)

( * ) Notice: Subject to any disclaimer, the term of this patent is extended or adjusted under 35 U.S.C. 154(b) by 355 days.

(21) Appl. No.: 14/298,507

(22) Filed: Jun. 6, 2014

(65) Prior Publication Data

US 2014/0288902 A1    Sep. 25, 2014

Related U.S. Application Data

(63) Continuation of application No. PCT/CN2013/080321, filed on Jul. 29, 2013.

(30) Foreign Application Priority Data

Dec. 26, 2012   (CN) .......................... 2012 1 0573774

(51) Int. Cl.
  *G06F 17/50* (2006.01)
  *E01B 35/12* (2006.01)
(52) U.S. Cl.
  CPC .......... *G06F 17/5009* (2013.01); *E01B 35/12* (2013.01)

(58) Field of Classification Search
  USPC ........................................................ 703/2, 7
  See application file for complete search history.

(56) References Cited

U.S. PATENT DOCUMENTS 5,205,368 A    4/1993   Hafner .......................... 177/163

FOREIGN PATENT DOCUMENTS

CN    102109419 A    6/2011
CN    102650574 A    8/2012
  (Continued)

OTHER PUBLICATIONS

Chinese International Search Report of corresponding International PCT Application No. PCT/CN2013/080321, dated Nov. 7, 2013.
  (Continued)

*Primary Examiner* — Thai Phan
(74) *Attorney, Agent, or Firm* — J.C. Patents

(57) ABSTRACT

The present invention discloses a simulated loading method and an apparatus for moving load of a wheel axle in rail transportation. Multiple actuators are arranged right above rail sleepers along rail direction. The two continuous rails are connected to the rail sleepers via fastening systems and are cut into discrete independent rail segments right above the rail sleeper. The anti-drop member satisfies the applications of compression and uplift force of the actuator. The input load of each actuator is obtained from the load-time history of a single fastening system under moving load of a wheel axle according to a train-rail-subgrade theory model, and adjacent actuators perform dynamic excitation in turn with a same time interval to achieve simulation of moving load of a wheel axle under different speed. This invention provides a reliable and convenient loading platform for experimental study of the rail transportation.

4 Claims, 4 Drawing Sheets

(56) References Cited

FOREIGN PATENT DOCUMENTS

| CN | 103015280 A | 4/2013 |
|---|---|---|
| CN | 203096538 U | 7/2013 |

OTHER PUBLICATIONS

Wang, Qi-Yun et al., "Study on Track-subgrade Model of High-speed Railway and Dynamical Loading" Journal of the China Railway Society, vol. 34, No. 12, Dec. 2012, pp.
Chinese First Examination Report of corresponding China Application No. 201210573774.4, dated Feb. 26, 2014.

SIMULATED LOADING METHOD AND APPARATUS FOR MOVING LOAD OF WHEEL AXLE IN RAIL TRANSPORTATION

CROSS-REFERENCE TO RELATED APPLICATIONS

This application is a continuation of International Application No. PCT/CN2013/080321, filed on Jul. 29, 2013, which claims priority to Chinese Patent Application No. 201210573774.4, filed on Dec. 26, 2012, both of which are hereby incorporated by reference in their entireties.

FIELD OF THE TECHNOLOGY

The present invention relates to a loading method and an apparatus for a load, in particular relates to a simulated loading method and an apparatus for moving load of a wheel axle in rail transportation.

BACKGROUND

Rail transportation is developing rapidly in China. Intercity railway and high-speed railway as well as city subway and light rail are all under rapid construction. However, with the construction and operation of rail transportation facilities, more and more engineering problems appear. When a train passes through at a high speed, the train load is transmitted to the structure under the rail via interaction between the wheel axle and the rail. Compared with conventional fixed-point cyclic loading, the interaction between the wheel axle and the rail typically has moving effect and speed effect. As the wheel axle moves, each structure layer under the rail experiences a same loading process along the moving direction of the train. This loading characteristic is quite different from the fixed-point loading, which results in that the rail structure and the subgrade structure represent different dynamic performance. Therefore, achieving an effective simulation of load moving process of the train wheel axle is of importance to the research in actual dynamic performance of the rail transportation infrastructure. At present, the experimental methods of load simulation of a wheel axle mainly include laboratory model test and in-situ test. Since the laboratory model test is limited by model size and moving speed, it is not easy to realize high-speed moving loading for a real train. Although the in-situ test can adopt actual moving process of the wheel axle, but the environment is complicated and cannot be easily controlled, thus the repeatability is poor. The existing wheel axle dynamic load simulation apparatus, such as SBZ30 dynamic exciter which supports frequency modulation and amplitude modulation, adopts a rapid rotating eccentric block to create vertical excitation so as to achieve a high-frequency excitation of a fixed position. However, the shortcoming is: the mobility of the load of the wheel axle cannot be achieved. Another test system for simulating moving load effect of high-speed transportation adopts a forward-reverse loader, which is controlled by a centrifugal rotating motor, to drive the vertical exciter to achieve a moving loading of the wheel axle load. However, a constant moving of the wheel axle load at a high speed cannot be achieved due to the size limit.

SUMMARY

In order to overcome the shortcomings of the laboratory model test and the in-situ test, the objective of the present invention is to provide a simulated loading method and an apparatus for moving load of a wheel axle in rail transportation, in order to achieve high-speed moving of the wheel axle load.

In order to achieve the above objective, the technical solution adopted by the present invention is:

1. A simulated loading method for moving load of a wheel axle in rail transportation comprises the following steps:

Step 1: Based on a verified train-rail-subgrade theory model, a force-time history curve of a single fastening system under different moving speeds v of a wheel axle can be obtained.

Step 2: Two continuous rails are connected to rail sleepers via a plurality of fastening systems. Spacing between two adjacent rail sleepers along rail direction is set as $\Delta s$ in accordance with design standards of high-speed railway. Then the two rails are cut into multiple pairs of independent rail segments right above the rail sleepers by the rail sleepers. Connection properties between the rails and the rail sleepers remain unchanged.

Step 3: A distribution beam is located right above each pair of rail segments in Step 2. An actuator is connected to top center of the distribution beam. The force-time history curve of a single fastening system acquired in Step 1 is adopted as a load excitation curve of each actuator.

Step 4: Each actuator in Step 3 has the same load excitation curve. A time interval $\Delta t$ exists between start excitations of adjacent actuators, and the time interval $\Delta t$ is determined by the spacing $\Delta s$ and the moving speed v:

$$\Delta t = \frac{\Delta s}{v}.$$

Step 5: The adjacent actuators perform the same dynamic excitation sequentially with the time interval $\Delta t$ along the moving direction of the wheel axle, and thereby, the moving load of the wheel axle at different moving speed v can be simulated.

2. A simulated loading apparatus for moving load of a wheel axle in rail transportation:

Multiple actuators are arranged right above each rail sleeper of high-speed railway along rail direction. The bottom of each actuator is connected to the top center of a distribution beam by high-strength bolts. The bottom of two ends of the distribution beam is mounted right above two rails. The two rails are arranged above the rail sleepers and are cut into multiple pairs of independent rail segments right above the rail sleepers by the rail sleepers, each pair of the rail segments is connected to corresponding rail sleeper via a fastening system. The rail sleepers are located on a roadbed and the roadbed is located on a subgrade.

The top of each actuator is connected to the bottom center of a transverse reaction beam. Two ends of each transverse reaction beam are fixed onto two longitudinal reaction beams, two ends of each longitudinal reaction beams are connected to two supporting pillars. The bottom of each supporting pillar is fixed onto the ground.

An anti-drop member is located at the bottom of the two ends of the distribution beam and fixedly mounted to top of each pair of rail segments, and the anti-drop member (3) can achieve applications of vertical compression force and uplift force of the actuator.

The present invention has the following beneficial effects:

(1) After the two rails are cut into rail segments, the adjacent actuators adopt the same force-time history curve of a single fastening system as the load excitation curve.

Then the adjacent actuators perform dynamic excitation sequentially with the same time interval along the moving direction of the wheel axle. Therefore, the moving load of the wheel axle at different moving speed can be simulated instead of the real train wheel axle model. (2) The anti-drop member satisfies the applications of vertical compression force and uplift force of the actuator. (3) A long road section for accelerating train speed is no longer needed, and the size of the laboratory test model is reduced. This invention provides a reliable and convenient loading platform for experimental study of the rail transportation.

In the figures: 1—actuator, 2—distribution beam, 3—anti-drop member, 4—high-strength bolt, 5—fastening system, 6—rail, 7—rail sleeper, 8—roadbed, 9—subgrade, 10—transverse reaction beam, 11—longitudinal reaction beam, 12—supporting pillar.

DETAILED DESCRIPTION

The present invention is described below in further details with reference to the accompanying drawings and embodiments.

Figure 1:
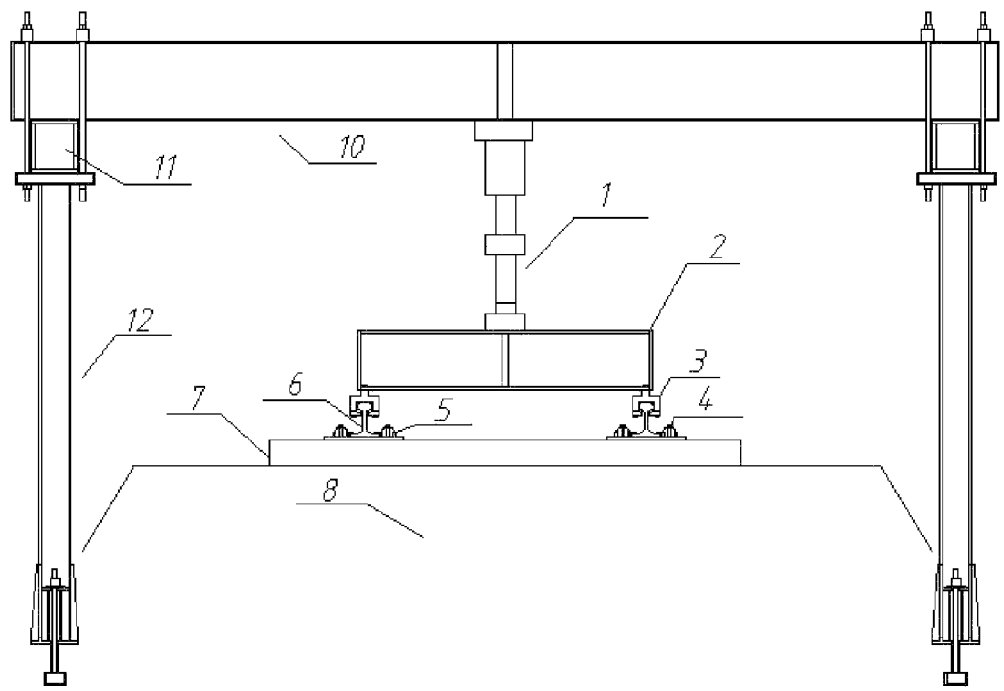
FIG. 1 is a transverse schematic diagram of the apparatus of the present invention.
Figure 2:
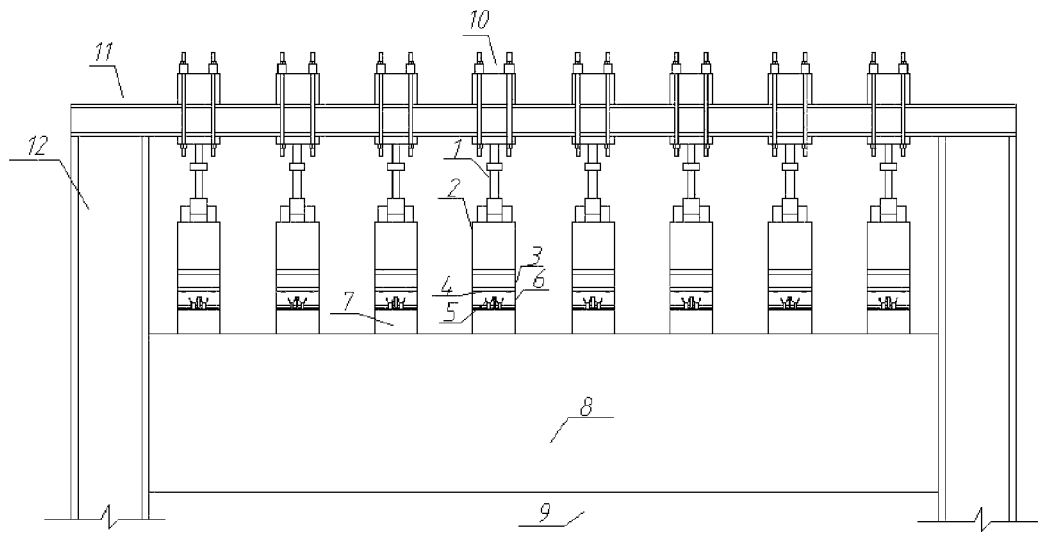
FIG. 2 is a longitudinal schematic diagram of the apparatus of the present invention.
Figure 3:
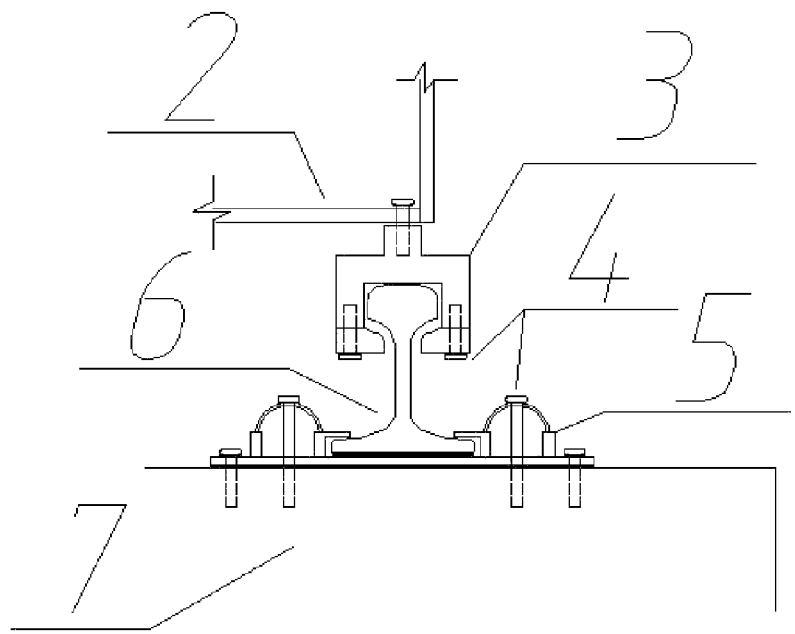
FIG. 3 is a transverse schematic diagram of connection of a rail segment.
Figure 4:
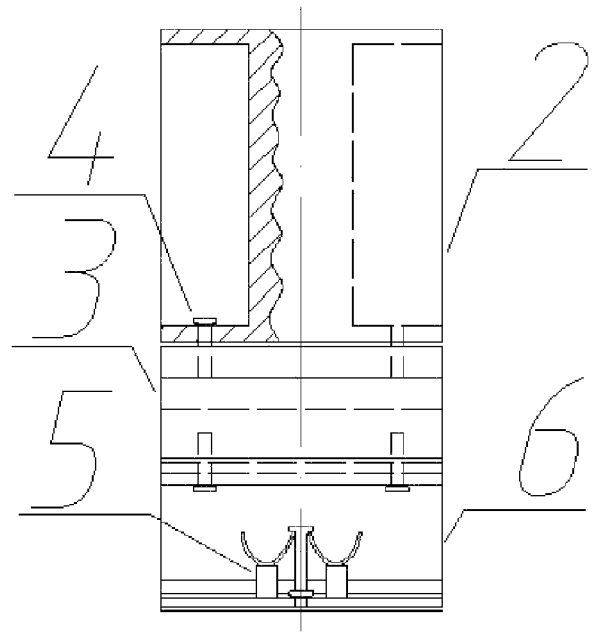
FIG. 4 is a longitudinal schematic diagram of connection of a rail segment.

The present embodiment is performed on the simulated loading apparatus for moving load of a wheel axle in rail transportation shown in FIG. 1 and FIG. 2. A ballasted railway structure is adopted. CHN60-type rail 6 is connected to III-type reinforced concrete rail sleeper 7 via WJ-7-type fastening system 5. Roadbed 8 is composed of roadbed surface layer and roadbed bottom layer. The roadbed surface layer is filled with graded gravel, and the roadbed bottom layer is filled with A/B fillings. Totally eight actuators 1 are adopted and located right over eight rail sleepers 7 long rail direction with the spacing of $\Delta s = 0.625$ m. The bottom of each actuator 1 is connected to the top center of a distribution beam 2 by high-strength bolts 4. An anti-drop member 3 is adopted to connect the bottom of the two ends of the distribution beam 2 to each pair of rail segments 6, which satisfies the applications of vertical compression force and uplift force of the actuator 1. The two continuous rails 6 are fixed on the rail sleeper 7 and are cut into discrete rail segments 6 with length of 0.3 m. Each pair of rail segments 6 are connected to the rail sleeper 7 by two fastening systems 5, as shown in FIG. 3 and FIG. 4. The rail sleepers 7 locate on a roadbed 8 and underlying subgrade 9. The top of each actuator 1 is connected to the bottom center of a transverse reaction beam 10. Two ends of each counter-force transverse beam 10 are fixed on two longitudinal reaction beams 11, two ends of which are connected with two supporting pillars 12. The bottom of each supporting pillar 12 is fixed on the ground.

Figure 5:
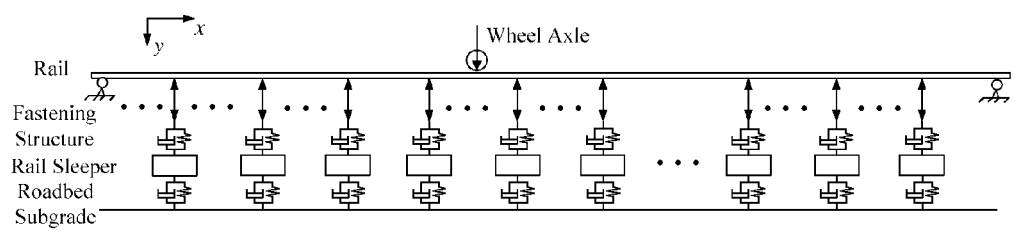
FIG. 5 is a theory schematic diagram of train-rail-subgrade theory model under movement of the wheel axle.

A plane structure assumption of the train-rail-subgrade theory model under movement of the the whole train is shown in FIG. 5, which is composed of the wheel axle, rail 6, fastening system 5, rail sleeper 7, roadbed 8 and subgrade 9. The rail 6 adopts Euler-beam assumption, and is assumed as a simply supported beam. The discrete distributed rail sleeper 7 is assumed as a mass block. Both the fastening system 5 and the roadbed 8 adopt viscoelastic spring assumption, wherein the roadbed 8 is considered as distributed spring and damping. The dynamic force caused by the interaction between the wheel axle and the rail 6 under the moving train is supported by the fastening systems 5 which distribute under the rail 6.

Figure 6:
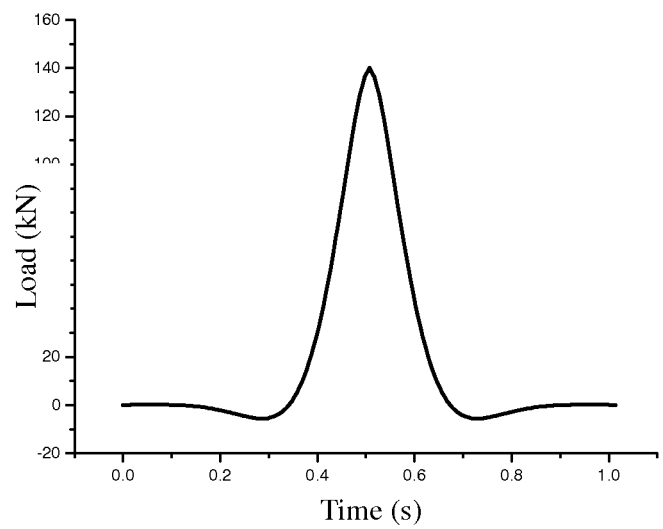
FIG. 6 is a load excitation curve of an actuator.

Since the present model is to study the mass system issue of moving structure rather than dynamic issue of the typical fixed-point loading, a system of combined partial differential equations is adopted as the governing equations. The equilibrium equation of the train subsystem, the equilibrium equation of the rail 6 and the equilibrium equation of the rail sleeper 7 are transformed into a system of ordinary differential equations by using a mode decomposition method. Then the force-time history curve of a single fastening system can be acquired by using NEWMARK method, taking train speed of 13.5 km/h as an example shown in FIG. 6, and the acquired curve is adopted as a load excitation curve of each actuator.

The load excitation curve of each actuator is the same. A time interval $\Delta t$ exists between the load excitation curves of adjacent actuators, which is determined by spacing $\Delta s$ of the adjacent fastening systems and train speed v. Take the spacing $\Delta s = 0.625$ m and train speed at 13.5 km/h as an example, the time interval $\Delta t$ can be expressed as:

$$\Delta t = \frac{\Delta s}{v} = 0.1667 \text{ s,}$$

The adjacent actuators perform the same dynamic excitation sequentially with the time interval $\Delta t = 0.1667$ s along the moving direction of the whole train. Therefore, the moving load of the wheel axle at different moving speeds can be simulated.

What is claimed is:

1. Simulated loading method for a load on a track roadbed from a moving wheel axle load in rail transportation, characterized by comprising the following steps:

step 1, based on a verified train-rail-subgrade theory model, a force-time history curve of a single fastening system at different moving speeds v of the wheel axle is obtained;

step 2, two continuous rails are connected to rail sleepers via a plurality of fastening systems, wherein a spacing between two adjacent rail sleepers along rail direction is $\Delta s$ which is determined in accordance with design standards of high-speed railway, then the two continuous rails are cut into multiple pairs of independent rail segments right above the rail sleepers, with connection properties between the rails and the rail sleepers being remained unchanged;

step 3, a distribution beam is located right above each pair of the independent rail segments in step 2, and an actuator is connected to a top center of the distribution beam, then the force-time history curve of a single fastening system acquired in step 1 is adopted as a load excitation curve for each actuator;

step 4, each actuator in step 3 has the same load excitation curve, and there is a time interval $\Delta t$ between exciting adjacent actuators, and the time interval $\Delta t$ is determined by the spacing $\Delta s$ and the moving speed v:

$$\Delta t = \frac{\Delta s}{v};$$

step 5, the adjacent actuators, along the rail direction, perform the same dynamic excitation sequentially at the time interval Δt, and thereby, the load on the railway roadbed from the moving wheel axle load at different moving speeds v is simulated.

2. A simulated loading apparatus for a load on a track roadbed from a moving wheel axle load in rail transportation according to the loading method of claim 1, wherein: multiple actuators (1) are arranged right above each of the rail sleepers of high-speed railway along rail direction, a bottom of each of the multiple actuators is connected to the top center of the distribution beam by high-strength bolts, bottoms of two ends of the distribution beam are mounted right above the two continuous rails, the two continuous rails are connected to the rail sleepers via the fastening systems and are cut into multiple pairs of independent rail segments right above the rail sleepers, the rail sleepers are located on the track roadbed.

3. The simulated loading apparatus for a load on a track roadbed from a moving wheel axle load in rail transportation according to claim 2, wherein: a top of each of the multiple actuators is connected to a bottom center of a transverse reaction beam, two ends of the transverse reaction beam are fixed onto two longitudinal reaction beams, two ends of each of the two longitudinal reaction beams are connected to two supporting pillars, a bottom of each of the two supporting pillar is fixed onto the ground.

4. The simulated loading apparatus for a load on a track roadbed from a moving wheel axle in rail transportation according to claim 2, wherein: an anti-drop member is located at the bottoms of the two ends of the distribution beam and fixedly mounted to a top of each pair of the independent rail segments, and the anti-drop member can achieve applications of vertical compression force and uplift force of the actuator.

\* \* \* \* \*